US012763695B2

(12) United States Patent
Cho et al.

(10) Patent No.: US 12,763,695 B2
(45) Date of Patent: Oct. 13, 2026

(54) CONVERTER

(71) Applicant: LG INNOTEK CO., LTD., Seoul (KR)

(72) Inventors: Yong Seok Cho, Seoul (KR); Won Seok Nam, Seoul (KR); Jae Sam Lee, Seoul (KR); Yun Young Jung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 164 days.

(21) Appl. No.: 18/692,973

(22) PCT Filed: Sep. 16, 2022

(86) PCT No.: PCT/KR2022/013847
§ 371 (c)(1),
(2) Date: Mar. 18, 2024

(87) PCT Pub. No.: WO2023/043249
PCT Pub. Date: Mar. 23, 2023

(65) Prior Publication Data

US 2024/0396468 A1 Nov. 28, 2024

(30) Foreign Application Priority Data

Sep. 17, 2021 (KR) ........................ 10-2021-0125310

(51) Int. Cl.
*H02M 7/00* (2006.01)
*H05K 7/20* (2006.01)

(52) U.S. Cl.
CPC ........ *H02M 7/003* (2013.01); *H05K 7/20254* (2013.01)

(58) Field of Classification Search
CPC .......... H02M 7/003; H02M 7/48; H02M 7/00; H05K 7/20254; H05K 7/20; H05K 7/20927
See application file for complete search history.

(56) References Cited

U.S. PATENT DOCUMENTS 4,267,528 A * 5/1981 Thornberry ............ H04B 15/02 455/310
5,343,359 A * 8/1994 Morton .................. H05K 1/141 361/784
(Continued)

FOREIGN PATENT DOCUMENTS

CN 112423569 A 2/2021
JP 2001308246 A * 11/2001
(Continued)

OTHER PUBLICATIONS

Suzuki Atsushi; Kuwabara Heikichi; Yasukawa Akio; Motobe Mitsusachi; Yamamura Hirohisa; Obara Sanshiro; Sasaki Kaname, "Power Converter", Nov. 2, 2001, Hitachi LTD, Entire Document (Translation of JP 2001308246). (Year: 2001).*
(Continued)

*Primary Examiner* — Stephen S Sul
(74) *Attorney, Agent, or Firm* — SALIWANCHIK, LLOYD & EISENSCHENK

(57) ABSTRACT

The converter comprises: a first housing having a flow path; a second housing coupled to the first housing; a board located between the first housing and the second housing; and a cooling plate located between the board and the first housing. The cooling plate includes a grounding region electrically connected to a grounding pattern of the board, and a position of the cooling plate is located between the first housing and the second housing and exposed to the outside of the first housing.

19 Claims, 5 Drawing Sheets

(56) References Cited

U.S. PATENT DOCUMENTS

| | | | | |
|---|---|---|---|---|
| 5,727,618 | A * | 3/1998 | Mundinger | H01S 5/02423 257/E23.098 |
| 2006/0284211 | A1 * | 12/2006 | Takubo | H02M 7/003 257/E25.031 |
| 2010/0091457 | A1 * | 4/2010 | Krause | H01L 23/473 361/689 |
| 2020/0077530 | A1 * | 3/2020 | Jung | H05K 7/14322 |
| 2020/0335424 | A1 * | 10/2020 | Fukakusa | H01L 23/473 |
| 2022/0298968 | A1 * | 9/2022 | Forsdike | B23K 20/10 |
| 2023/0008735 | A1 * | 1/2023 | Tamaoka | H02K 11/33 |
| 2023/0273295 | A1 * | 8/2023 | Ohara | G01S 13/931 342/350 |
| 2024/0098881 | A1 * | 3/2024 | Suzuki | H01G 11/78 |

FOREIGN PATENT DOCUMENTS

| | | | | |
|---|---|---|---|---|
| JP | 2013-31250 | A | 2/2013 | |
| JP | 2014-131394 | A | 7/2014 | |
| KR | 10-2013-0065390 | A | 6/2013 | |
| KR | 10-2013-0096747 | A | 8/2013 | |
| KR | 10-2019-0135225 | A | 12/2019 | |
| TW | 202114480 | A | 4/2021 | |
| WO | WO-2018093195 | A1 * | 5/2018 | H01F 41/04 |

OTHER PUBLICATIONS

Kim, Ji Hoon; Kim, Geun Ho; Na, Hyun Min; Jung, Jae Hoo; Bae, Seok; Yeom, Jai Hoon, "DC-DC Converter", May 24, 2018, LG Innotek Co LTD., Entire Document (Translation of WO 2018093195). (Year: 2018).*

Ji Hyeon Baik; Jae Hoo Jung; Kyung Rae Cho, "Converter", Dec. 6, 2019, LG Innotek Co Ltd., Entire Document (Translation of KR 20190135225) (of record, cited in the IDS, including Original Document). (Year: 2019).*

International Search Report dated Dec. 22, 2022 in International Application No. PCT/KR2022/013847.

Office Action dated Aug. 12, 2026 in Chinese Application No. 202280062564.0.

* cited by examiner

CONVERTER

CROSS-REFERENCE TO RELATED APPLICATIONS

This application is the U.S. national stage application of International Patent Application No. PCT/KR2022/013847, filed Sep. 16, 2022, which claims the benefit under 35 U.S.C. § 119 of Korean Application No. 10-2021-0125310, filed Sep. 17, 2021, the disclosures of each of which are incorporated herein by reference in their entirety.

TECHNICAL FIELD

The present embodiment relates to a converter.

BACKGROUND ART

Engine electrical devices (starting devices, ignition devices, and charging devices) and lighting devices are common as automobile electrical devices, but recently, most systems, including chassis electrical devices, are becoming electrically electronic as vehicles become more electronically controlled.

Various electrical components such as lamps, audio systems, heaters, and air conditioners installed in automobiles are designed to receive power from the battery when the car is stopped and from the generator when driving, and at this time, the generation capacity of the 14V power system is used as a normal power supply voltage.

Recently, along with the development of the information technology industry, various new technologies (motor-type power steering, Internet, and the like) aimed to enhance the convenience of automobiles are being adopted by vehicles, and in the future, it is expected that the development of new technologies that can maximally utilize the current automotive systems will continue.

Hybrid electric vehicles (HEV), regardless of soft or hard type, are equipped with a DC-DC converter (Low Voltage DC-DC Converter) to supply electric loads (12V). In addition, a DC-DC converter, which serves as a generator (alternator) in general gasoline vehicles, lowers the high voltage of the main battery (usually a high-voltage battery of 144V or higher) and supplies 12V voltage for electrical loads.

A DC-DC converter is an electronic circuit device that converts direct current power of a certain voltage into direct current power of a different voltage, and is used in various fields such as television sets and automotive electronics.

The external shape of an electronic device is formed by housing. Inside the housing, a number of electronic components for driving are disposed. The electronic components generate heat when driven. Heat can cause overload of electronic components, disrupting setup functions and causing malfunctions. Accordingly, a structure or means for dissipating heat from components inside an electronic device is required.

In addition, in order to dissipate heat from the components inside the converter, the converter case is generally made of a metal material with good thermal conductivity. However, when implemented with a metal material, the weight of the converter increases and the price becomes expensive, therefore in order to reduce the weight, it is necessary to make a case using materials other instead of metal, and in this case, a means for heat dissipation is also required.

DETAILED DESCRIPTION OF THE INVENTION

Technical Subject

The present embodiment is intended to provide a converter that can improve heat dissipation efficiency by improving the structure.

In addition, it is intended to solve the problem of heat dissipation occurring when using a case made of a material other than metal, and to provide a converter capable of implementing a heat dissipation function while realizing weight reduction.

Technical Solution

A converter according to the present embodiment comprises: a first housing including a flow path; a second housing being coupled to the first housing; a board being disposed between the first housing and the second housing; and a cooling plate located between the board and the first housing, wherein the cooling plate includes a grounding region being electrically connected to a grounding pattern of the board, and a portion of the cooling plate is located between the first housing and the second housing and exposed to the outside of the first housing.

A plurality of electronic components is disposed on one surface or the other surface of the board, and a portion of the cooling plate may be in contact with the plurality of electronic components.

The cooling plate includes a plurality of contact portions being protruded from the other surface of the base, and the plurality of contact portions may correspond to positions of the plurality of electronic components.

The shape of the flow path may be formed to correspond to the arrangement region of the plurality of electronic components.

A sealing member being disposed between the cooling plate and the second housing and being disposed so as to surround the periphery of the flow path may be included.

The sealing member may have a shape corresponding to the shape of the flow path.

The first housing and the second housing may include a non-metallic material.

The cooling plate may include a metal material.

The cooling plate includes a base including one surface facing the first housing and the other surface facing the second housing, wherein the grounding region is a portion being protruded from the other surface of the base, and wherein a portion of the cooling plate may be formed to be protruded from the side surface of the base.

The first housing may include a groove into which a portion of the cooling plate is inserted.

The grounding region of the cooling plate is protruded from the upper surface of the cooling plate and come into contact with the grounding pattern of the board.

The cross-sectional area of the cooling plate is smaller than the cross-sectional area of the board and may be larger than the cross-sectional area of the flow path.

The cooling plate may be larger than the region being formed by the outermost portion of the flow path.

A converter according to another embodiment comprise: a first housing including a flow path; a second housing being coupled to the first housing; a board being disposed between the first housing and the second housing; and a cooling plate being disposed between the board and the first housing, wherein the cooling plate includes a base and a plurality of heat dissipation fins being protruded from one surface of the base, and wherein the plurality of heat dissipation fins are disposed inside the flow path.

A converter according to yet another embodiment comprises: a first housing including a flow path; a second housing being coupled to the first housing; a board being disposed between the first housing and the second housing; a cooling plate being disposed between the board and the first housing; and a sealing member being disposed between the cooling plate and the first housing, wherein the first housing includes a plurality of holes being formed around the flow path to discharge refrigerant leaking from the flow path to the outside.

Advantageous Effects

There is an advantage of improving heat dissipation efficiency because the heat generated from the board is dissipated through the cooling plate through the present embodiment.

In addition, there is an advantage of further enhancing the electrical characteristics inside the converter by realizing the grounding structure of the board through the cooling plate.

In addition, there is an advantage of inhibiting the refrigerant from leaking to other space inside the converter through the refrigerant leaking prevention structure through a plurality of sealing members and holes.

BEST MODE

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention. In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used.

These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or disposed in "on (above)" or "below (under)" of each component, "on (above)" or "below (under)" means that it includes not only the case where the two components are directly in contact with, but also the case where one or more other components are formed or disposed between the two components. In addition, when expressed as "on (above)" or "below (under)", the meaning of not only an upward direction but also a downward direction based on one component may be included.

Figure 1:
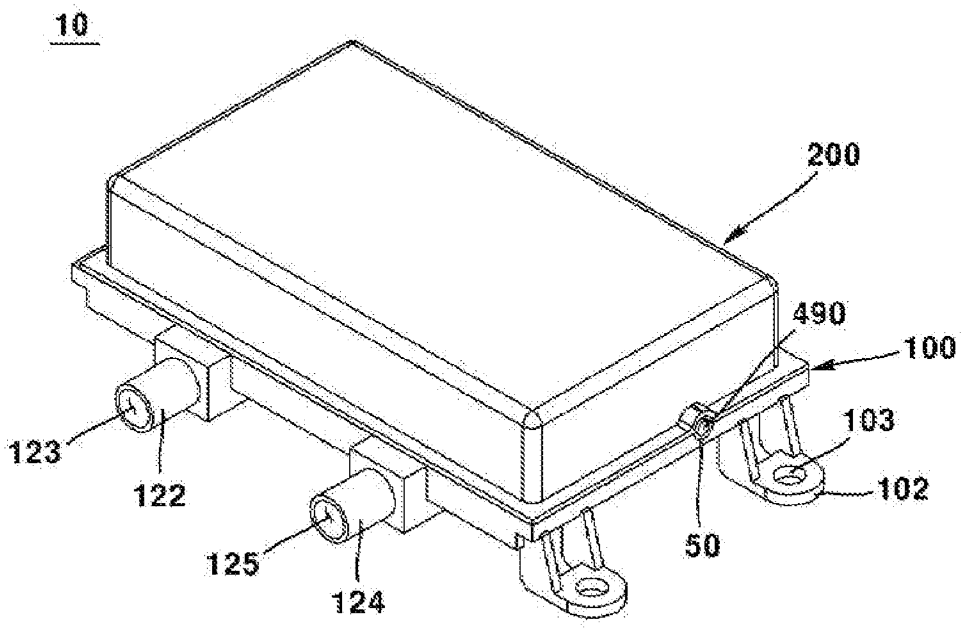
FIG. 1 is a perspective view illustrating the appearance of a converter according to an embodiment of the present invention.
Figure 2:
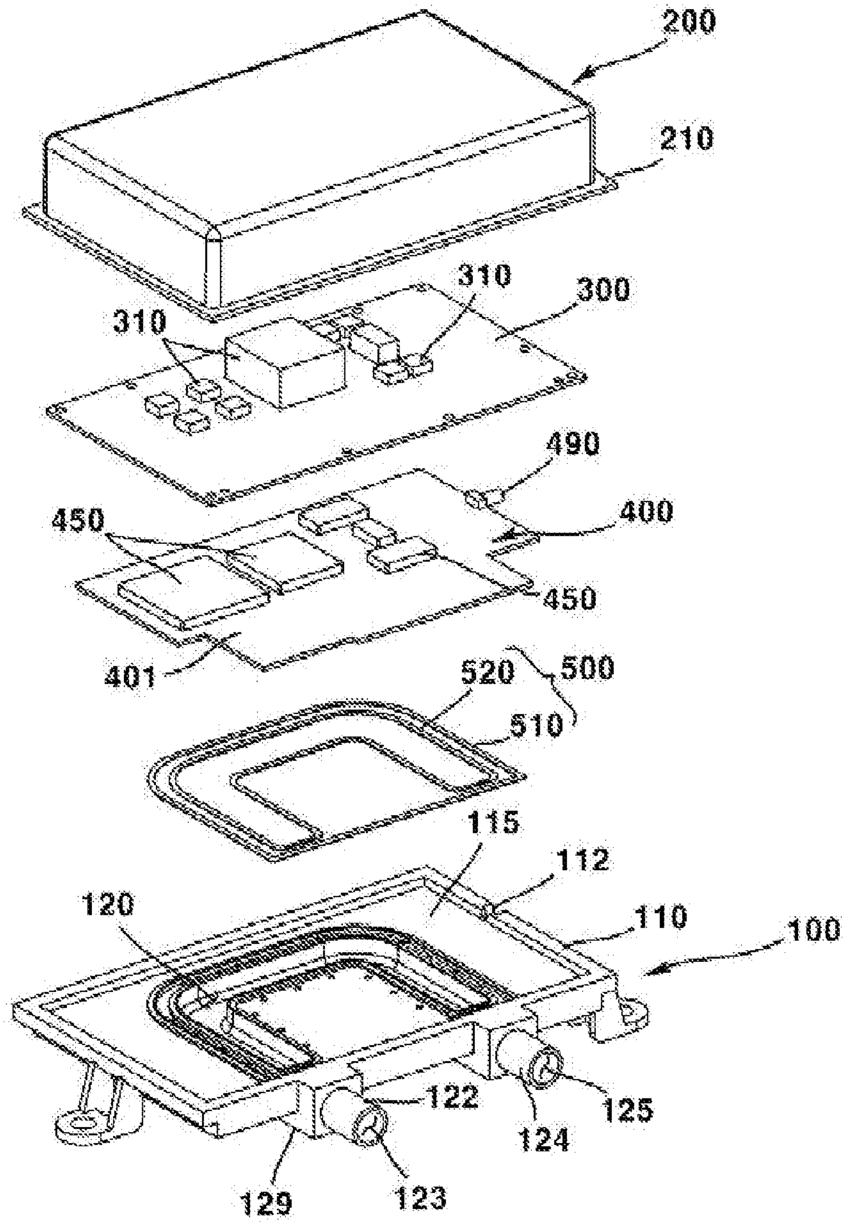
FIG. 2 is an exploded perspective view of a converter according to an embodiment of the present invention.
Figure 3:
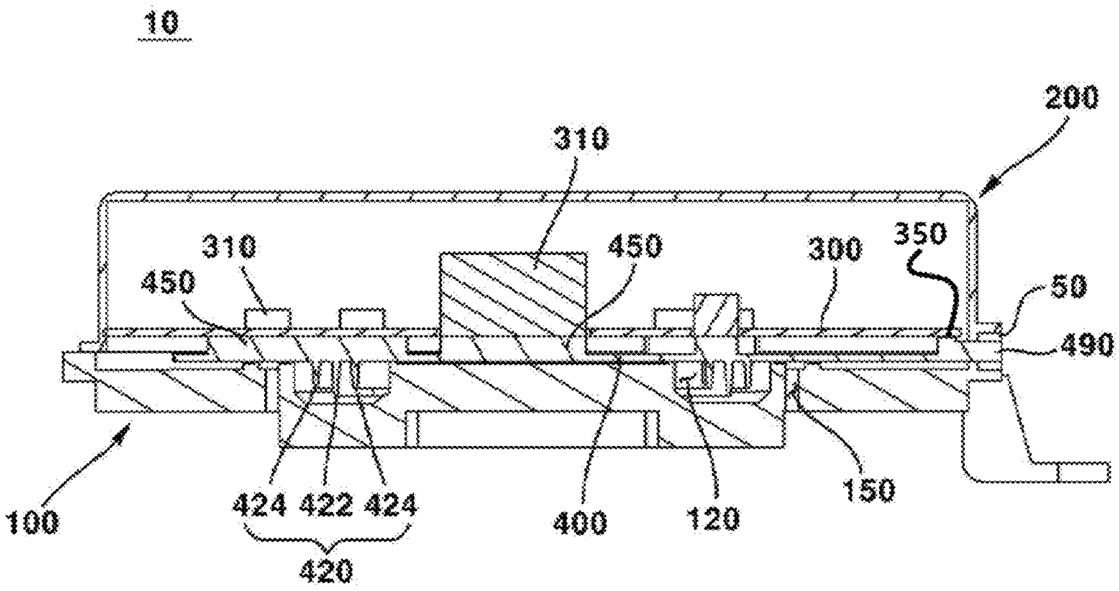
FIG. 3 is a cross-sectional view illustrating the internal structure of a converter according to an embodiment of the present invention.
Figure 4:
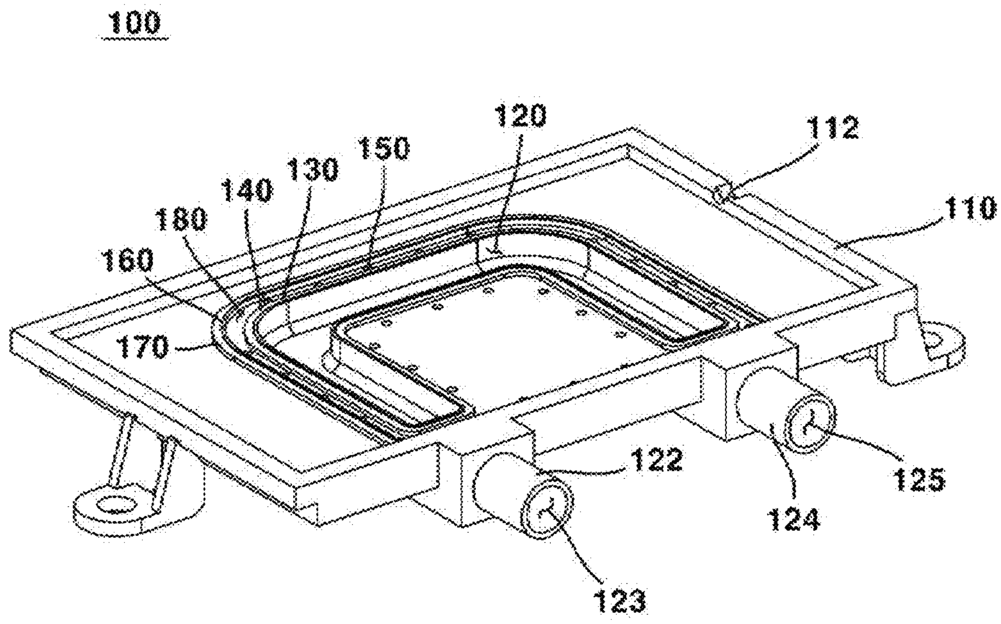
FIG. 4 is a perspective view illustrating an upper surface of a first housing according to an embodiment of the present invention.
Figure 5:
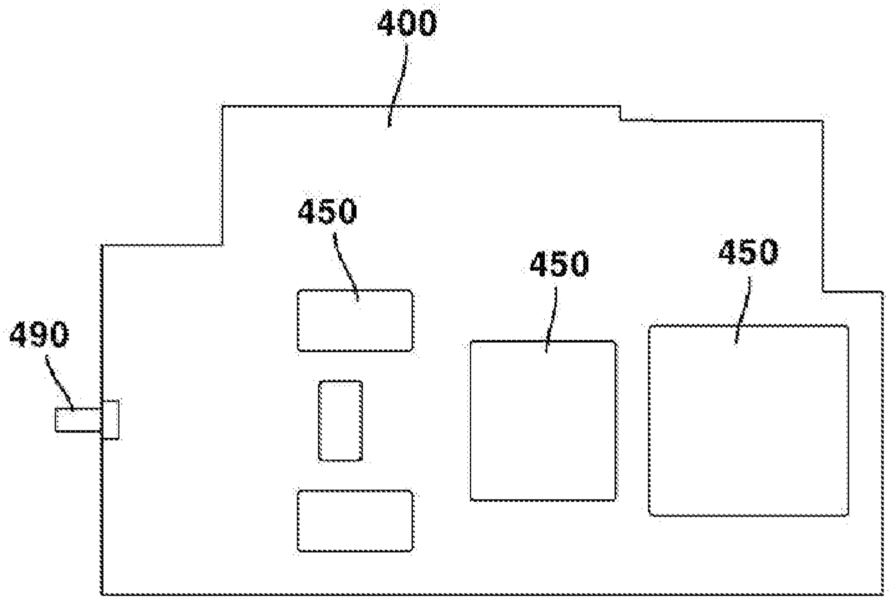
FIG. 5 is a plan view illustrating an upper surface of a cooling plate according to an embodiment of the present invention.
Figure 6:
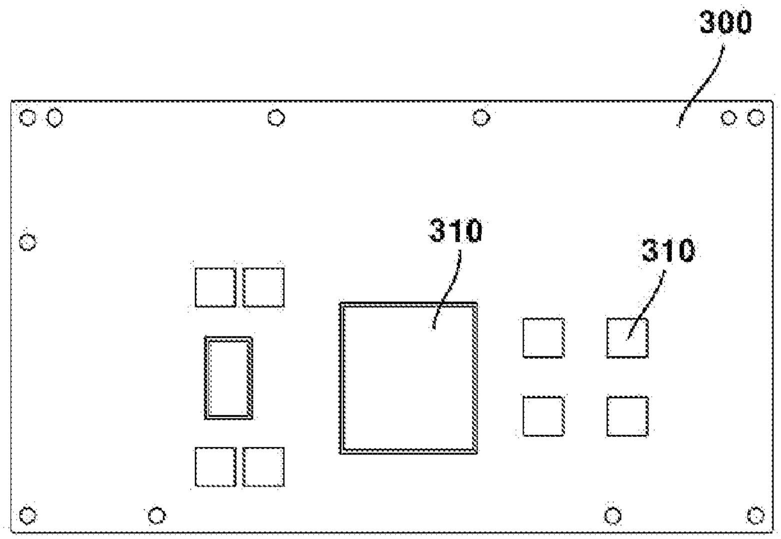
FIG. 6 is a plan view illustrating an upper surface of a board according to an embodiment of the present invention.
Figure 7:
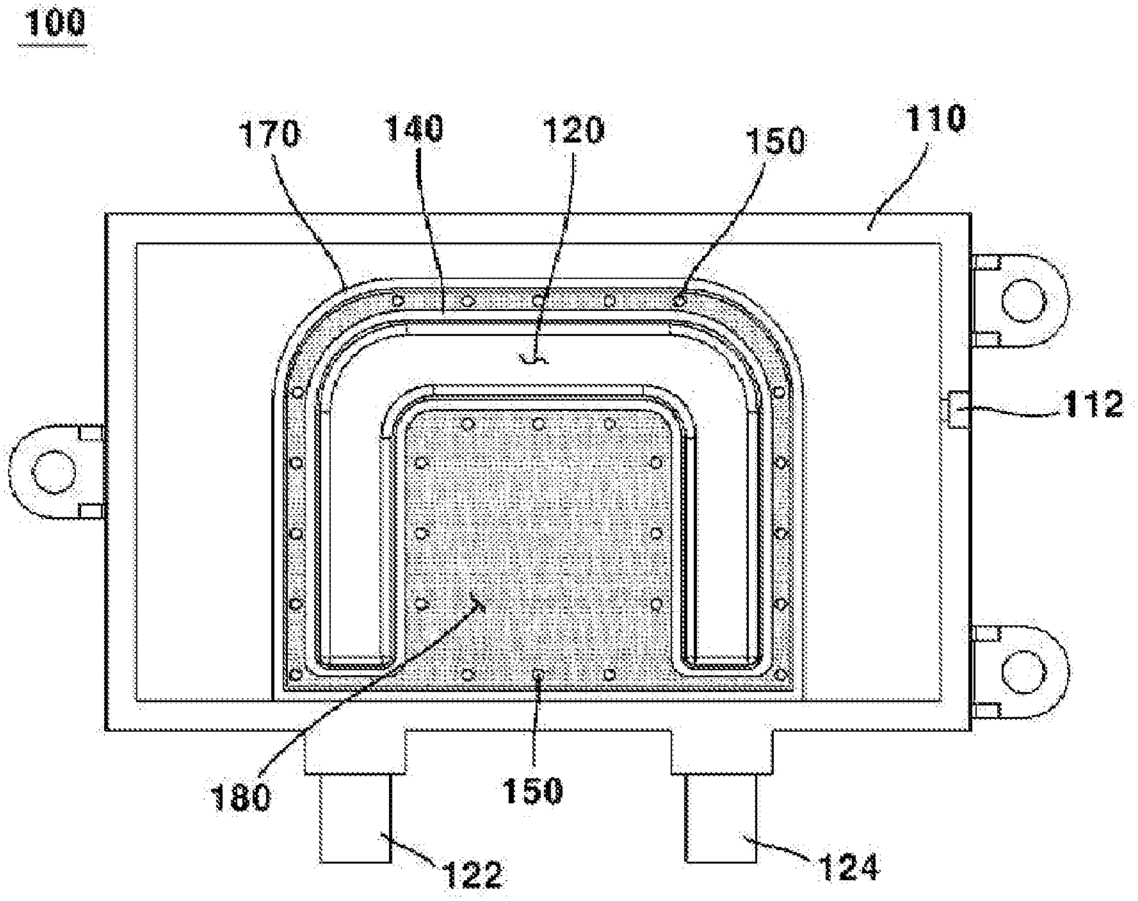
FIG. 7 is a plan view illustrating an upper surface of a first housing according to an embodiment of the present invention.

FIG. 1 is a perspective view illustrating the appearance of a converter according to an embodiment of the present invention; FIG. 2 is an exploded perspective view of a converter according to an embodiment of the present invention; FIG. 3 is a cross-sectional view illustrating the internal structure of a converter according to an embodiment of the present invention; FIG. 4 is a perspective view illustrating an upper surface of a first housing according to an embodiment of the present invention; FIG. 5 is a plan view illustrating an upper surface of a cooling plate according to an embodiment of the present invention; FIG. 6 is a plan view illustrating an upper surface of a board according to an embodiment of the present invention; and FIG. 7 is a plan view illustrating an upper surface of a first housing according to an embodiment of the present invention.

Referring to FIGS. 1 to 7, the external shape of the converter 10 according to an embodiment of the present invention may be formed by coupling the first housing 100 and the second housing 200. The first housing 100 and the second housing 200 may be coupled in an up and down direction. One or more electronic components for driving the converter 10 can be accommodated in an internal space formed by coupling the first housing 100 and the second housing 200.

The first housing 100 and the second housing 200 may be formed of a non-metallic material. For example, each material of the first housing 100 and the second housing 200 may be plastic.

The first housing 100 may be disposed at a lower portion of the second housing 200. The first housing 100 may have a rectangular cross-sectional shape.

The first housing 100 may include a bottom plate 115 and a side wall 110 being protruded upward from an upper surface of the bottom plate 115. The side wall 110 is disposed along the edge of an upper surface of the bottom plate 115, and an upper surface of the bottom plate 115 may have a groove shape due to the side wall 110. A first groove 112 may be disposed on an upper surface of the side wall 110 to be recessed lower than other regions and form a portion of the hole 50 through which a grounding terminal 490, which will be described later, penetrates.

The first housing 100 may include a bracket 102 for fixing the first housing 100 to the installation region of the converter 10. The bracket 102 is formed as one body with the first housing 100 and may include a screw hole 103 for screw-coupling into the installation region. The brackets 102 may be provided in plural numbers and may be disposed to be spaced apart from one another along the edge of the first housing 100.

The first housing 100 may include a flow path 120. The flow path 120 may be disposed on an upper surface of the bottom plate 115. The flow path 120 may be disposed on an inner surface of an internal space of the converter 10. The flow path 120 may be disposed on a bottom surface of an internal space of the converter 10. The flow path 120 may be formed to be stepped downward from other regions on an upper surface of the bottom plate 115 of the first housing 100. The flow path 120 may be formed by a portion of the upper surface of the bottom plate 115 of the first housing 100 being recessed downward. The flow path 120 may have a groove shape.

The flow path 120 may be formed as a single line from one end to the other end, and the flow path 120 may have a region that is bent at least once. For example, the flow path 120 may have a cross-section that is approximately letter "⊏" shaped. Refrigerant may flow in the flow path 120, and the refrigerant may flow from one end of the flow path 120 toward the other end. Due to the flow of refrigerant, the heat being generated from electronic components disposed in a space inside the converter 10 can be dissipated by heat exchange with the refrigerant.

The region where the flow path 120 is formed on a lower surface of the first housing 100 may have a shape being protruded more downward than other regions.

A refrigerant inlet 122 may be disposed at one end of the flow path 120. The refrigerant inlet 122 may have a shape being protruded outward from a side surface of the first housing 100, and an inlet 123 communicating with the flow path 120 may be formed at an inner side. The refrigerant inlet 122 may be formed as one body with the first housing 100.

A refrigerant discharge port 124 may be disposed at the other end of the passage 120. The refrigerant discharge port 124 may have a shape that protrudes outward from the side of the first housing 100, and a discharge outlet 125 communicating with the flow path 120 may be formed at an inner side. The refrigerant discharge port 124 may be formed as one body with the first housing 100.

Accordingly, the refrigerant flowing inside through the refrigerant inlet port 122 flows along the flow path 120 and can be discharged to the outside through the refrigerant discharge port 124.

The second housing 200 may be coupled to an upper portion of the first housing 100. The second housing 200 may have a rectangular cross-sectional shape.

The second housing 200 may include a box-shaped body and a coupling portion 210 being bent outward from the lower end of the body. The lower surface of the coupling portion 210 may be in contact with an upper surface of the side wall 110 of the first housing 100. The cross-sectional shape of the coupling portion 210 may be formed to correspond to the cross-sectional shape of the side wall 110. In a region among the lower surface of the coupling portion 210 facing the first groove 112, a second groove (not shown) being formed to be more recessed upward than other regions and forming a portion of the hole 50 may be disposed so that the grounding terminal 490, which will be described later, penetrates. Therefore, when the first housing 100 and the second housing 200 are coupled, the hole 50 may be formed by coupling the first groove 112 and the second groove. In order to form the hole 50, the cross-sectional shapes of the first groove 112 and the second groove may each be semi-circular.

The converter 10 may include a board 300. The board 300 may be a printed circuit board (PCB). The board 300 may be disposed between the first housing 100 and the second housing 200. The board 300 may be disposed in the internal space between the first housing 100 and the second housing 200. The board 300 is formed in a plate shape, and one or more electronic components 310 for driving the converter 100 may be disposed on an upper surface or a lower surface. For example, the electronic component 310 may include an inductor for obtaining inductance, a transformer for voltage conversion, an FET element, and the like. The electronic components 310 may be provided in plural and disposed to be spaced apart from one another on the board 300. The electronic component 310 may be referred to as a heating element in that it generates heat when driven.

The board 300 may be screw-coupled to an inner surface of the first housing 100 or the second housing 200. To this end, a screw hole penetrating from one surface to the other surface may be formed in the board 300. The screw holes may be provided in plural numbers and disposed to be spaced apart from one another along the edge of the board 300.

The board 300 may have a rectangular cross-sectional shape.

The board 300 may be disposed so that at least a portion of the board 300 is overlapped with the flow path 120 in an up and down direction. The electronic component 310 may be disposed to be overlapped with the flow path 120 in an up and down direction.

The converter 10 may include a cooling plate 400. The cooling plate 400 may be a heat sink for dissipating heat being generated by one or more electronic components 310 in the converter 10, and may include a material with high thermal conductivity. The cooling plate 400 is formed in a plate shape and may be disposed at an internal space between the first housing 100 and the second housing 200. The cooling plate 400 may be disposed at a lower portion of the board 300 inside the internal space.

The cooling plate 400 may be made of a metal material.

The cooling plate 400 may be disposed to cover the flow path 120. The cooling plate 400 may be disposed at an upper portion of the flow path 120. A portion of the lower surface of the cooling plate 400 may be in contact with an upper surface of the first housing 100. The cross-sectional area of the cooling plate 400 may be smaller than the cross-sectional area of the board 300 and larger than the cross-sectional area of the flow path 120. The cooling plate 400 may be larger than a region being formed by the outermost portion of the flow path 120.

The cooling plate 400 may include a base 401 being formed in the shape of a metal plate. The upper surface of the base 401 may include a contact portion 450 being protruded more upward than other regions. The contact portion 450 may be disposed to be overlapped with the electronic component 310 being disposed on the board 300 in an up and down direction. The contact portion 450 may be disposed at a position corresponding to the electronic component 310. The contact portion 450 may be in contact with the electronic component 310. For example, when the electronic component 310 is disposed on an upper surface of the board 300 and the cooling plate 400 is disposed on a lower surface of the board 300, the upper surface of the contact portion 450 may be in contact with a lead of the electronic component 310 that penetrates the board 300 or a solder region for soldering the electronic component 310 to the board 300. By bringing the contact portion 450 into contact with the electronic component 310 or a region of the board 300, heat being generated from the electronic component 310 can be efficiently transferred to the cooling plate 400.

The cooling plate 400 may include a grounding terminal 490. The grounding terminal 490 may be formed to be protruded more outward than other regions from the side of the base 401. The grounding terminal 490 may be disposed between the first housing 100 and the second housing 200 and exposed to the outside of the first housing 100 or the second housing 200. The grounding terminal 490 may be exposed to the outside through the hole 50. Accordingly, a portion of the grounding terminal 490 is disposed in the first groove 112 of the first housing 100, and another portion may be disposed in the second groove formed in the second housing 200. A sealing member (not shown) may be disposed between the inner circumferential surface of the hole 50 and the grounding terminal 490 to prevent foreign substances from entering the converter 10. Although not shown, the grounding terminal 490 is electrically connected to a grounding region on the system (not shown) side being connected to the converter 10, and also, it is electrically connected to the grounding pattern 350 or grounding region exposed on the surface or included in the inner surface of the board 300 so that noise or electromagnetic waves being generated from the electronic components 310 disposed on the board 300 may be discharged to the outside of the converter 10.

The cooling plate 400 may include heat dissipation fins 420 (see FIG. 3). The heat dissipation fins 420 may be formed to be protruded more downward than other regions on a lower surface of the base 401. The heat dissipation fins 420 may be disposed within the flow path 120. Therefore, when the refrigerant flows in the flow path 120, the contact area between the cooling plate 400 and the refrigerant can be expanded by the heat dissipation fins 420. Thus, the heat of the electronic component 310 transferred to the cooling plate 400 or the heat dissipation fins 420 can be efficiently transferred to the refrigerant.

The heat dissipation fins 420 may be provided in plural numbers. For example, the heat dissipation fins 420 may include a first fin 422 being disposed in the center and a plurality of second fins 424 being disposed opposite to one another on both sides of the first fin 422. The plurality of second pins 424 may be spaced apart from the first pin 422 by a predetermined distance. The length of the first fin 422 being protruded from the lower surface of the base 401 may be longer than the length of the second fins 424 being protruded from the lower surface of the base 401. The lower end of the first pin 422 may be spaced apart from the bottom surface of the flow path 120 by a predetermined distance.

The heat dissipation fins 420 may be formed to correspond to the shape of the flow path 120. The arrangement region of the heat dissipation fins 420 may correspond to the arrangement region of the flow path 120. That is, each of the first pin 422 and the plurality of second pins 424 may be spaced apart from each other and have a length corresponding to the shape of the flow path 120.

Meanwhile, in order to inhibit the refrigerant inside the flow path 120 from leaking to other regions, the converter 10 may include a sealing member 500.

In detail, a first partition wall 140 and a second partition wall 170, being protruded more upward than other regions, may be disposed on an upper surface of the bottom plate 115 of the first housing 100. The first partition wall 140 may be disposed along the edge of the flow path 120. The second partition wall 170 is disposed outside the first partition wall 140 and may be spaced apart from the first partition wall 140 by a predetermined distance.

The sealing member 500 may include a first sealing member 520 being disposed between the cooling plate 400 and the first partition wall 140, and a second sealing member 510 being disposed between the cooling plate 400 and the second partition wall 170. The first sealing member 520 is formed to correspond to the cross-sectional shape of the first partition wall 140, and the second sealing member 510 may be formed to correspond to the cross-sectional shape of the second partition wall 170.

A first guide rib 130 being protruded more upward than other regions may be formed on an upper surface of the first partition wall 140. The first guide rib 130 is formed along the inner edge of the first partition wall 140 to firmly fix the first sealing member 520 on the first partition wall 140. The upper surface of the first guide rib 130 may be in contact with the lower surface of the cooling plate 400.

A second guide rib 160 being protruded more upward than other regions may be formed on an upper surface of the second partition wall 170. The second guide rib 160 is formed along the inner edge of the second partition wall 170 to firmly fix the second sealing member 510 on the second partition wall 170. The upper surface of the second guide rib 160 may be in contact with the lower surface of the cooling plate 400.

Therefore, the double shielding structure through the first sealing member 520 and the second sealing member 510 can inhibit the refrigerant in the flow path 120 from leaking to other regions.

Meanwhile, a refrigerant discharge region 180 may be formed between the first partition wall 140 and the second partition wall 170. The refrigerant discharge region 180 is a region for discharging the leaked refrigerant to the outside of the first housing 100 when the refrigerant leaks between the first sealing member 520 and the cooling plate 400, and may include at least one hole 150.

In detail, the refrigerant discharge region 180 may have a groove shape between the first partition wall 140 and the second partition wall 170. The upper surface of the refrigerant discharge region 180 may form the same plane as the upper surface of the bottom plate 115 of the first housing 100, however, unlike this, the upper surface of the refrigerant discharge region 180 may be formed to be more stepped downward than the upper surface of the bottom plate 115 of the first housing 100.

The refrigerant discharge region 180 is disposed outside the flow path 120 and may include the hole 150. The hole 150 is formed to penetrate from the inner surface to the outer surface of the first housing 100, so that when the refrigerant leaks into the refrigerant discharge region 180, the leaked refrigerant can be discharged to the outside.

The holes 150 may be provided in plural numbers and may be disposed to be spaced apart from one another around the flow path 120. The plurality of holes 150 may be disposed to be overlapped with the cooling plate 400 in an up and down direction. Accordingly, the plurality of holes 150 are disposed between the first sealing member 520 and the second sealing member 510, so even if the refrigerant flowing in the flow path 120 leaks through the gap between the first sealing member 520 and the first partition wall 140 or the cooling plate 400, it flows in the space between the first housing 100 and the second housing 200, so it is possible to inhibit the refrigerant from flowing to other components in the converter 10 since the leaked refrigerant can be discharged to the outside of the converter 10 through the hole 150 so as to inhibit damage to other components including electronic components 310. In addition, the second sealing member 510 can inhibit the refrigerant from leaking into the space between the first housing 100 and the second housing 200.

In the above description, it is described that all the components constituting the embodiments of the present invention are combined or operated in one, but the present invention is not necessarily limited to these embodiments. In other words, within the scope of the present invention, all of the components may be selectively operated in combination with one or more. In addition, the terms "comprise", "include" or "having" described above mean that the corresponding component may be inherent unless specifically stated otherwise, and thus it should be construed that it does not exclude other components, but further include other components instead. All terms, including technical and scientific terms, have the same meaning as commonly understood by one of ordinary skill in the art unless otherwise defined. Terms used generally, such as terms defined in a dictionary, should be interpreted to coincide with the contextual meaning of the related art, and shall not be interpreted in an ideal or excessively formal sense unless explicitly defined in the present invention.

The above description is merely illustrative of the technical idea of the present invention, and those skilled in the art to which the present invention pertains may make various modifications and changes without departing from the essential characteristics of the present invention. Therefore, the embodiments disclosed in the present invention are not intended to limit the technical idea of the present invention but to describe the present invention, and the scope of the technical idea of the present invention is not limited by these embodiments. The protection scope of the present invention should be interpreted by the following claims, and all technical ideas within the equivalent scope should be interpreted as being included in the scope of the present invention.

The invention claimed is:

1. A converter comprising:
a first housing including a flow path;
a second housing coupled to the first housing;
a board disposed between the first housing and the second housing; and
a cooling plate located between the board and the first housing,
wherein the cooling plate includes a grounding region electrically connected to a grounding pattern of the board,
wherein a first portion of the cooling plate is located between the first housing and the second housing and is exposed to an outside of the first housing,
wherein the cooling plate includes a base including one surface facing the first housing and another surface facing the second housing,
wherein the grounding region is a portion protruded from the other surface of the base, and
wherein a portion of the cooling plate is formed to be protruded from a side surface of the base.

2. The converter according to claim 1,
wherein a plurality of electronic components is disposed on one surface or another surface of the board, and
wherein a second portion of the cooling plate is in contact with the plurality of electronic components.

3. The converter according to claim 2,
wherein the cooling plate includes a plurality of contact portions protruded from the other surface of the board, and
wherein the plurality of contact portions corresponds to positions of the plurality of electronic components.

4. The converter according to claim 2,
wherein a shape of the flow path is formed to correspond to an arrangement region of the plurality of electronic components.

5. The converter according to claim 1, including:
a sealing member disposed between the cooling plate and the second housing and disposed so as to surround a periphery of the flow path.

6. The converter according to claim 5,
wherein the sealing member has a shape corresponding to a shape of the flow path.

7. The converter according to claim 1,
wherein the first housing and the second housing are each made of non-metallic material.

8. The converter according to claim 1,
wherein the cooling plate is made of metal.

9. The converter according to claim 1,
wherein the first housing includes a groove into which the first portion of the cooling plate is inserted.

10. The converter according to claim 1,
wherein the grounding region of the cooling plate is protruded from an upper surface of the cooling plate and comes into contact with the grounding pattern of the board.

11. The converter according to claim 1,
wherein a cross-sectional area of the cooling plate is smaller than a cross-sectional area of the board and larger than a cross-sectional area of the flow path.

12. The converter according to claim 11,
wherein the cooling plate is larger than a region formed by an outermost portion of the flow path.

13. A converter comprising:
a first housing including a flow path;
a second housing coupled to the first housing;
a board disposed between the first housing and the second housing; and
a cooling plate disposed between the board and the first housing,
wherein the cooling plate includes a base and a plurality of heat dissipation fins being protruded from one surface of the base and a grounding region electrically connected to a ground pattern of the board,
wherein the plurality of heat dissipation fins are disposed inside the flow path,
wherein the base includes the one surface facing the first housing and another surface facing the second housing,
wherein the grounding region is a portion protruded from the other surface of the base, and
wherein a portion of the cooling plate is formed to be protruded from a side surface of the base.

14. The converter according to claim 13, wherein the plurality of heat dissipation fins are formed to correspond to a shape of the flow path and are arranged to be spaced apart from each other at a predetermined distance.

15. The converter according to claim 13, comprising a sealing member disposed between the cooling plate and the second housing and arranged to surround the flow path.

16. The converter according to claim 15, wherein the sealing member has a shape corresponding to a shape of the flow path.

17. The converter according to claim 13, wherein the first housing and the second housing are each made of non-metallic material, and wherein the cooling plate is made of metal.

18. The converter according to claim 13, wherein the first housing includes a plurality of holes formed around the flow path to discharge refrigerant leaking from the flow path to an outside.

19. A converter comprising:

a first housing including a flow path;

a second housing coupled to the first housing;

a board disposed between the first housing and the second housing;

a cooling plate disposed between the board and the first housing; and a sealing member disposed between the cooling plate and the first housing, wherein the cooling plate includes a base and a plurality of heat dissipation fins being protruded from one surface of the base and a grounding region electrically connected to a ground pattern of the board, wherein the first housing includes a plurality of holes formed around the flow path to discharge refrigerant leaking from the flow path to an outside, wherein the base includes the one surface facing the first housing and another surface facing the second housing, wherein the grounding region is a portion protruded from the other surface of the base, and wherein a portion of the cooling plate is formed to be protruded from a side surface of the base.

* * * * *